United States Patent
Sasaki et al.

(10) Patent No.: US 11,015,117 B2
(45) Date of Patent: May 25, 2021

(54) SEMICONDUCTOR NANOPARTICLE-CONTAINING DISPERSION LIQUID AND FILM

(71) Applicant: FUJIFILM Corporation, Tokyo (JP)

(72) Inventors: Tsutomu Sasaki, Kanagawa (JP); Masashi Ono, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 286 days.

(21) Appl. No.: 16/367,250

(22) Filed: Mar. 28, 2019

(65) Prior Publication Data

US 2019/0218456 A1 Jul. 18, 2019

Related U.S. Application Data

(63) Continuation of application No. PCT/JP2017/034303, filed on Sep. 22, 2017.

(30) Foreign Application Priority Data

Sep. 29, 2016 (JP) .............................. JP2016-191018
Mar. 9, 2017 (JP) .............................. JP2017-044949

(51) Int. Cl.
| | |
|---|---|
| C09K 11/70 | (2006.01) |
| C09K 11/02 | (2006.01) |
| B82Y 40/00 | (2011.01) |
| B82Y 30/00 | (2011.01) |
| B82Y 20/00 | (2011.01) |
| H01L 29/06 | (2006.01) |

(52) U.S. Cl.
CPC ............ *C09K 11/703* (2013.01); *B82Y 20/00* (2013.01); *B82Y 30/00* (2013.01); *B82Y 40/00* (2013.01); *C09K 11/02* (2013.01); *H01L 29/06* (2013.01)

(58) Field of Classification Search
CPC ....... C09K 11/703; C09K 11/02; B82Y 20/00; B82Y 30/00; B82Y 40/00
See application file for complete search history.

(56) References Cited

U.S. PATENT DOCUMENTS

| | | | |
|---|---|---|---|
| 5,972,527 A | 10/1999 | Kaijou et al. | |
| 9,834,724 B2 * | 12/2017 | Kim | ..................... C09K 11/565 |
| 10,711,190 B2 * | 7/2020 | Ono | ..................... C09K 11/565 |
| 2006/0239902 A1 | 10/2006 | Kimura et al. | |
| 2011/0135878 A1 | 6/2011 | Kimura et al. | |
| 2011/0227034 A1 | 9/2011 | Kang et al. | |
| 2012/0082793 A1 | 4/2012 | Kimura et al. | |
| 2017/0247613 A1 | 8/2017 | Ono | |

FOREIGN PATENT DOCUMENTS

| | | |
|---|---|---|
| JP | H06318406 | 11/1994 |
| JP | H10296900 | 11/1998 |
| JP | H11149826 | 6/1999 |
| JP | 2011195810 | 10/2011 |
| JP | 2015217359 | 12/2015 |
| WO | 2004043853 | 5/2004 |
| WO | 2016080435 | 5/2016 |
| WO | WO 2017/074897 | * 5/2017 |

OTHER PUBLICATIONS

"International Search Report (Form PCT/ISA/210) of PCT/JP2017/034303," dated Dec. 12, 2017, with English translation thereof, pp. 1-5.

"Written Opinion of the International Searching Authority (Form PCT/ISA/237) of PCT/JP2017/034303," dated Dec. 12, 2017, with English translation thereof, pp. 1-7.

* cited by examiner

*Primary Examiner* — C Melissa Koslow
(74) *Attorney, Agent, or Firm* — JCIPRNET

(57) ABSTRACT

An object of the present invention is to provide a semiconductor nanoparticle-containing dispersion liquid having high initial luminous efficacy and exhibiting excellent moisture resistance; and a film produced using the dispersion liquid. The semiconductor nanoparticle-containing dispersion liquid of the present invention contains semiconductor nanoparticles from which zinc, sulfur, and indium are detected by X-ray photoelectron spectroscopy; and acrylate or methacrylate, in which a molar ratio of zinc to indium in the semiconductor nanoparticles which is acquired by the X-ray photoelectron spectroscopy satisfies Expression (1a).

$$2.25 < Zn/In < 9 \qquad (1a)$$

20 Claims, No Drawings

SEMICONDUCTOR NANOPARTICLE-CONTAINING DISPERSION LIQUID AND FILM

CROSS-REFERENCE TO RELATED APPLICATIONS

This application is a Continuation of PCT International Application No. PCT/JP2017/034303 filed on Sep. 22, 2017, which claims priority under 35 U.S.C. § 119(a) to Japanese Patent Application No. 2016-191018 filed on Sep. 29, 2016 and Japanese Patent Application No. 2017-044949 filed on Mar. 9, 2017. Each of the above applications is hereby expressly incorporated by reference, in its entirety, into the present application.

BACKGROUND OF THE INVENTION

1. Field of the Invention

The present invention relates to a semiconductor nanoparticle-containing dispersion liquid and a film.

2. Description of the Related Art

Colloidal semiconductor nanoparticles (hereinafter, also referred to as "quantum dots") in a single nano-sized level which are obtained by a chemical synthesis method from a solution containing metal elements are started to be practically used as a fluorescent material in a wavelength conversion film for some display applications and also expected to be applied to biological labels, light emitting diodes, solar cells, thin film transistors, and the like. WO2016/080435A is exemplified as a document that discloses semiconductor nanoparticles.

Examples of a method of forming a film using such semiconductor nanoparticles include a method of coating a base material or the like with a dispersion liquid containing semiconductor nanoparticles and a polymerizable compound.

SUMMARY OF THE INVENTION

Under the above-described circumstances, as the result of production of semiconductor nanoparticles with reference to WO2016/080435A and the like and preparation of a dispersion liquid that contains the obtained semiconductor nanoparticles and a polymerizable compound, the present inventors found that the luminous efficacy (initial luminous efficacy) thereof does not necessarily satisfy the level required in these days. Further, the present inventors also found that the luminous efficacy of the semiconductor nanoparticles is degraded due to water or moisture in some cases and the moisture resistance (unlikeliness of degradation in luminous efficacy due to water or moisture) of the prepared dispersion liquid does not necessarily satisfy the level required in these days.

The present invention has been made in consideration of the above-described circumstances, and an object thereof is to provide a semiconductor nanoparticle-containing dispersion liquid having high initial luminous efficacy and exhibiting excellent moisture resistance and a film produced using the dispersion liquid.

As the result of intensive research on the above-described problems conducted by the present inventors, it was found that the above-described problems can be solved by using acrylate or methacrylate as a polymerizable compound and setting a molar ratio (Zn/In) of zinc to indium in semiconductor nanoparticles to be in a specific range, thereby completing the present invention.

In other words, the present inventors found that the above-described problems can be solved by employing the following configurations.

(1) A semiconductor nanoparticle-containing dispersion liquid containing: semiconductor nanoparticles from which zinc, sulfur, and indium are detected by X-ray photoelectron spectroscopy; and acrylate or methacrylate, in which a molar ratio of zinc to indium in the semiconductor nanoparticles which is acquired by the X-ray photoelectron spectroscopy satisfies Expression (1a).

$$2.25 < Zn/In < 9 \quad (1a)$$

(2) The semiconductor nanoparticle-containing dispersion liquid according to (1), in which a molar ratio of sulfur to indium in the semiconductor nanoparticles which is acquired by the X-ray photoelectron spectroscopy satisfies Expression (2a).

$$1.25 < S/In < 10.6 \quad (2a)$$

(3) The semiconductor nanoparticle-containing dispersion liquid according to (1) or (2), in which, in a scattering intensity due to X-ray small angle scattering, an inclination of a tangent at a q value of 0.2 $nm^{-1}$ is in a range of −3 to 0.

(4) The semiconductor nanoparticle-containing dispersion liquid according to any one of (1) to (3), in which the molar ratio of zinc to indium in the semiconductor nanoparticles which is acquired by the X-ray photoelectron spectroscopy satisfies Expression (1b), and the molar ratio of sulfur to indium in the semiconductor nanoparticles which is acquired by the X-ray photoelectron spectroscopy satisfies Expression (2b), and in a scattering intensity due to X-ray small angle scattering, an inclination of a tangent at a q value of 0.2 $nm^{-1}$ is in a range of −2 to 0.

$$2.4 < Zn/In \leq 7.9 \quad (1b)$$

$$3.4 < S/In \leq 7.5 \quad (2b)$$

(5) The semiconductor nanoparticle-containing dispersion liquid according to any one of (1) to (4), in which the semiconductor nanoparticles have an average particle diameter of 6 nm or less.

(6) The semiconductor nanoparticle-containing dispersion liquid according to (5), in which the semiconductor nanoparticles have an average particle diameter of 3 nm to 5 nm.

(7) The semiconductor nanoparticle-containing dispersion liquid according to any one of (1) to (6), in which the semiconductor nanoparticle includes: a core which contains a Group III element and a Group V element; a first shell which covers at least a part of a surface of the core; and a second shell which covers at least a part of the first shell.

(8) The semiconductor nanoparticle-containing dispersion liquid according to (7), in which the Group III element contained in the core is In, and the Group V element contained in the core is any one of P, N, or As.

(9) The semiconductor nanoparticle-containing dispersion liquid according to (8), in which the Group III element contained in the core is In, and the Group V element contained in the core is P.

(10) The semiconductor nanoparticle-containing dispersion liquid according to any one of (7) to (9), in which the core further contains a Group II element.

(11) The semiconductor nanoparticle-containing dispersion liquid according to (10), in which the Group II element contained in the core is Zn.

(12) The semiconductor nanoparticle-containing dispersion liquid according to any one of (7) to (11), in which the first shell contains a Group II element or a Group III element, and in a case where the first shell contains the Group III element, the Group III element contained in the first shell is a Group III element different from the Group III element contained in the core.

(13) The semiconductor nanoparticle-containing dispersion liquid according to any one of (7) to (12), in which the first shell is a Group II-VI semiconductor which contains a Group II element and a Group VI element or a Group III-V semiconductor which contains a Group III element and a Group V element, and in a case where the first shell is the Group III-V semiconductor, the Group III element contained in the Group III-V semiconductor is a Group III element different from the Group III element contained in the core.

(14) The semiconductor nanoparticle-containing dispersion liquid according to (13), in which in a case where the first shell is the Group II-VI semiconductor, the Group II element is Zn and the Group VI element is Se or S, and in a case where the first shell is the Group III-V semiconductor, the Group III element is Ga and the Group V element is P.

(15) The semiconductor nanoparticle-containing dispersion liquid according to (13), in which the first shell is the Group III-V semiconductor, the Group III element is Ga, and the Group V element is P.

(16) The semiconductor nanoparticle-containing dispersion liquid according to any one of (7) to (15), in which the second shell is a Group II-VI semiconductor which contains a Group II element and a Group VI element or a Group III-V semiconductor which contains a Group III element and a Group V element.

(17) The semiconductor nanoparticle-containing dispersion liquid according to (16), in which the second shell is the Group II-VI semiconductor, the Group II element is Zn, and the Group VI element is S.

(18) The semiconductor nanoparticle-containing dispersion liquid according to any one of (7) to (17), in which the core, the first shell, and the second shell are respectively a crystal system having a zinc blende structure.

(19) The semiconductor nanoparticle-containing dispersion liquid according to any one of (7) to (18), in which, among the core, the first shell, and the second shell, a band gap of the core is the smallest, and the core and the first shell respectively have a type 1 band structure.

(20) A film which is produced using the semiconductor nanoparticle-containing dispersion liquid according to any one of (1) to (19).

As described below, according to the present invention, it is possible to provide a semiconductor nanoparticle-containing dispersion liquid having high initial luminous efficacy and exhibiting excellent moisture resistance and a film produced using the dispersion liquid.

DESCRIPTION OF THE PREFERRED EMBODIMENTS

Hereinafter, the present invention will be described in detail.

The description of constituent elements below will be occasionally made based on representative embodiments of the present invention, but the present invention is not limited to these embodiments.

In the present specification, the numerical ranges expressed using "to" in the present specification indicate the ranges including the numerical values described before and after "to" as the lower limits and the upper limits.

Further, in the present specification, acrylate or methacrylate is also referred to as "(meth)acrylate". Further, acrylic acid or methacrylic acid is also referred to as "(meth)acrylic acid".

[Semiconductor Nanoparticle-Containing Dispersion Liquid]

A semiconductor nanoparticle-containing dispersion liquid (hereinafter, also referred to as a "dispersion liquid according to the embodiment of the present invention") according to the embodiment of the present invention contains semiconductor nanoparticles from which zinc, sulfur, and indium are detected by X-ray photoelectron spectroscopy; and acrylate or (meth)acrylate, in which the molar ratio of zinc to indium in the semiconductor nanoparticles which is acquired by the X-ray photoelectron spectroscopy satisfies Expression (1a).

$$2.25 < Zn/In < 9 \tag{1a}$$

The dispersion liquid according to the embodiment of the present invention is considered to have high initial luminous efficacy and exhibit excellent moisture resistance by employing the above-described configuration. The reason for this is not clear, but can be assumed as follows.

As described above, the semiconductor nanoparticles contained in the dispersion liquid according to the embodiment of the present invention are semiconductor nanoparticles (hereinafter, also referred to as "specific semiconductor nanoparticles" or "semiconductor nanoparticles of the present invention") from which zinc, sulfur, and indium are detected by X-ray photoelectron spectroscopy and in which the molar ratio of zinc to indium acquired by the X-ray photoelectron spectroscopy satisfies an expression of "2.25<Zn/In<9". In other words, the specific semiconductor nanoparticles contained in the dispersion liquid according to the embodiment of the present invention contain a large amount of Zn relative to In. Further, (meth)acrylate contained in the dispersion liquid according to the embodiment of the present invention has a high affinity for Zn. Therefore, in the specific semiconductor nanoparticles contained in the dispersion liquid according to the embodiment of the present invention, it is assumed that In is protected (defects are less) by Zn and Zn is protected by (meth)acrylate. As the result, it is considered that markedly excellent moisture resistance is exhibited because water is unlikely to enter the specific semiconductor nanoparticles even in a case where the dispersion liquid according to the embodiment of the present invention is exposed to water or moisture. Further, as described above, it is considered that, since (meth)acrylate has a high affinity for Zn, the dispersibility of the specific semiconductor nanoparticles in the dispersion liquid is extremely high, and thus high initial luminous efficacy is exhibited. These mechanisms can also be speculated from the fact that the moisture resistance becomes insufficient in a case where the ratio of Zn/In is out of a specific range (Comparative Examples 1 and 4) and the fact that not only the initial luminous efficacy but also the moisture resistance become insufficient in a case where the dispersion liquid does not contain (meth)acrylate (Comparative Examples 2 and 3), as described in the comparative examples below.

Hereinafter, each component contained in the dispersion liquid according to the embodiment of the present invention will be described.

[Semiconductor Nanoparticles]

The semiconductor nanoparticles contained in the dispersion liquid according to the embodiment of the present invention are semiconductor nanoparticles (specific semiconductor nanoparticles) from which zinc, sulfur, and indium are detected by X-ray photoelectron spectroscopy and in which the molar ratio (Zn/In) of zinc to indium acquired by the X-ray photoelectron spectroscopy satisfies Expression (1a).

$$2.25 < Zn/In < 9 \quad (1a)$$

As described above, the specific semiconductor nanoparticles are semiconductor nanoparticles from which zinc, sulfur, and indium are detected by X-ray photoelectron spectroscopy. In other words, the specific semiconductor nanoparticles contain zinc (Zn), sulfur (S), and indium (In).

<Zn/In>

As described above, in the specific semiconductor nanoparticles, the molar ratio (Zn/In) of zinc to indium acquired by the X-ray photoelectron spectroscopy satisfies Expression (1a).

$$2.25 < Zn/In < 9 \quad (1a)$$

The ratio of Zn/In is a molar ratio of zinc to indium acquired by X-ray photoelectron spectroscopy (hereinafter, also referred to as XPS analysis) and is acquired by correcting the ratio of the peak intensity of a peak derived from zinc to a peak derived from indium using XPS analysis with a relative sensitivity coefficient for each element. The relative sensitivity coefficient is acquired by measuring measurement elements (measurement trajectory) described later related to standard samples whose compositions have been known (Journal of Surface Analysis Vol. 12 No. 3, p. 357 (2005)).

Here, the peak intensity ratio is measured by coating a non-doped Si substrate with a dispersion liquid (solvent: toluene) containing semiconductor nanoparticles using dried samples under the following measurement conditions. Further, the peak intensity indicates the area intensity obtained by subtracting the background from the observed peak and integrating the area of the peak with respect to the energy.

(Measurement Conditions)

Measuring device: Quantera SXM type XPS (manufactured by ULVAC-PHI, Inc.)

X-ray source: Al-Kα ray (analytic diameter: 100 μm, 25 W, 15 kV)

Extraction angle of photoelectrons: 45° C.

Measurement range: 300 μm×300 μm

Correction: charging correction using combination of electron gun and low-speed ion gun Measurement elements (measurement trajectory): C (1s), N (1s), O (1s), Si (2p), P (2p), S (2p), Cl (2p), Zn (2p3/2), Ga (2p3/2), In (3d5/2)

From the viewpoint of obtaining excellent effects of the present invention, it is preferable that the ratio of Zn/In satisfies Expression (1b).

$$2.4 < Zn/In \leq 7.9 \quad (1b)$$

<S/In>

From the viewpoint of obtaining excellent effects of the present invention, it is preferable that the molar ratio (S/In) of sulfur to indium in the specific semiconductor nanoparticles which is acquired by the X-ray photoelectron spectroscopy satisfies Expression (2a). The ratio of S/In is a molar ratio of sulfur to indium acquired by XPS analysis and is acquired by correcting the ratio of the peak intensity of a peak derived from sulfur to a peak derived from indium using XPS analysis with a relative sensitivity coefficient for each element.

A method of acquiring the relative sensitivity coefficient and a method of measuring the peak intensity ratio using XPS analysis are as described above.

$$1.25 < S/In < 10.6 \quad (2a)$$

From the viewpoint of obtaining excellent effects of the present invention, it is preferable that the ratio of S/In satisfies Expression (2b).

$$3.4 < S/In \leq 7.5 \quad (2b)$$

<Average Particle Diameter>

The average particle diameter of the specific semiconductor nanoparticles is not particularly limited, but is preferably 10 nm or less, more preferably 6 nm or less, and still more preferably 5 nm or less from the viewpoint of obtaining excellent effects of the present invention. The lower limit thereof is not also particularly limited, but is preferably 2 nm or greater and more preferably 3 nm or greater from the viewpoint of obtaining excellent effects of the present invention.

Here, the average particle diameter is a value obtained by directly observing at least 20 particles using a transmission electron microscope, calculating the diameters of circles having the same areas as the projected areas of the particles, and arithmetically averaging these values.

PREFERRED EMBODIMENTS

From the viewpoint of obtaining excellent effects of the present invention, it is preferable that the specific semiconductor nanoparticle is a core shell particle.

As a first preferred embodiment in a case where the specific semiconductor nanoparticle is a core shell particle, an embodiment (single shell shape) in which the core shell particle contains a core containing a Group III element and a Group V element and a shell covering at least a part of a surface of the core and containing a Group II element and a Group VI element is exemplified.

As a second preferred embodiment in the case where the specific semiconductor nanoparticle is a core shell particle, an embodiment (multi-shell shape) in which the core shell particle contains a core containing a Group III element and a Group V element, a first shell covering at least a part of a surface of the core, and a second shell covering at least a part of the first shell is exemplified.

Among these, from the viewpoint of obtaining excellent effects of the present invention, a multi-shell shape is preferable.

(Core)

In the case where the specific semiconductor nanoparticle is a core shell particle, it is preferable that the core contained in the core shell particle is a so-called Group III-V semiconductor that contains a Group III element and a Group V element.

(1) Group III Element

Specific examples of the Group III element include indium (In), aluminum (Al), and gallium (Ga). Among these, In is preferable.

(2) Group V Element

Specific examples of the Group V element include phosphorus (P), nitrogen (N), and arsenic (As). Among these, P is preferable.

In the present invention, a Group III-V semiconductor obtained by appropriately combining the Group III element and the Group V element exemplified above can be used as the core, but InP, InN, or InAs is preferable from the viewpoint that the luminous efficacy is further increased, the luminous half-width is narrowed, and a clear exciton peak is obtained. Among these, from the viewpoint of further increasing the luminous efficacy, InP is more preferable.

In the present invention, it is preferable that the core shell particle further contains a Group II element in addition to the Group III element and the Group V element described above. Particularly in a case where the core is InP, the lattice constant is decreased by doping Zn as the Group II element and the lattice matching performance with a shell (for example, GaP, ZnS, or the like described below) having a smaller lattice constant than that of InP becomes excellent.

(Shell)

In a case where the specific semiconductor nanoparticle is a core shell particle having a single shell shape, it is preferable that the shell is a so-called Group II-VI semiconductor which is formed of a material covering at least a part of a surface of the core and contains a Group II element and a Group VI element.

Here, according to the present invention, it is possible to confirm whether at least a part of the surface of the core is covered with the shell based on composition distribution analysis according to energy dispersive X-ray spectroscopy (EDX) using a transmission electron microscope (TEM).

(1) Group II Element

Specific examples of the Group II element include zinc (Zn), cadmium (Cd), and magnesium (Mg). Among these, Zn is preferable.

(2) Group VI Element

Specific examples of the Group VI element include sulfur (S), oxygen (O), selenium (Se), and tellurium (Te). Among these, S or Se is preferable and S is more preferable.

In the present invention, a Group II-VI semiconductor obtained by appropriately combining the Group II element and the Group VI element described above can be used as the shell, but it is preferable that the shell is a crystal system which is the same as or similar to the core described above. Specifically, ZnS or ZnSe is preferable and ZnS is more preferable from the viewpoint of the safety and the like.

(First Shell)

In a case where the specific semiconductor nanoparticle is a core shell particle having a multi-shell shape, the first shell is a material that covers at least a part of a surface of the core.

Here, in the present invention, it is possible to confirm whether at least a part of the surface of the core is covered with the first shell based on composition distribution analysis according to energy dispersive X-ray spectroscopy (EDX) using a transmission electron microscope (TEM).

In the present invention, from the viewpoint of easily suppressing defects at the interface between the core and the first shell, it is preferable that the first shell contains a Group II element or a Group III element.

Here, in a case where the first shell contains a Group III element, the Group III element contained in the first shell is a Group III element different from the Group III element contained in the core described above.

Further, in addition to a Group II-VI semiconductor and a Group III-V semiconductor described below, a Group III-VI semiconductor (such as $Ga_2O_3$, $Ga_2S_3$, or the like) containing a Group III element and a Group VI element is exemplified as the first shell containing a Group II element or a Group III element.

In the present invention, from the viewpoint of obtaining an excellent crystal phase with less defects, it is preferable that the first shell is a Group II-VI semiconductor containing a Group II element and a Group VI element or a Group III-V semiconductor containing a Group III element and a Group V element and more preferable that the first shell is a Group III-V semiconductor in which a difference in lattice constant between the above-described core and the first shell is small.

Here, in a case where the first shell is a Group III-V semiconductor, the Group III element contained in the Group III-V semiconductor is a Group III element different from the Group III element contained in the core described above.

(1) Group II-VI Semiconductor

Specific examples of the Group II element contained in the Group II-VI semiconductor include zinc (Zn), cadmium (Cd), and magnesium (Mg). Among these, Zn is preferable.

Further, specific examples of the Group VI element contained in the Group II-VI semiconductor include sulfur (S), oxygen (O), selenium (Se), and tellurium (Te). Among these, S or Se is preferable and S is more preferable.

A Group II-VI semiconductor obtained by appropriately combining the Group II element and the Group VI element described above can be used as the first shell, but it is preferable that the first shell is a crystal system (for example, a zinc blende structure) which is the same as or similar to the core described above. Specifically, ZnSe, ZnS, or a mixed crystal of these is preferable and ZnSe is more preferable.

(2) Group III-V Semiconductor

Specific examples of the Group III element contained in the Group III-V semiconductor include indium (In), aluminum (Al), and gallium (Ga). Among these, Ga is preferable. As described above, the Group III element contained in the Group III-V semiconductor is a Group III element different from the Group III element contained in the core described above. For example, in a case where the Group III element contained in the core is In, the Group III element contained in the Group III-V semiconductor is Al, Ga, or the like.

Further, specific examples of the Group V element contained in the Group III-V semiconductor include phosphorus (P), nitrogen (N), and arsenic (As). Among these, P is preferable.

A Group III-V semiconductor obtained by appropriately combining the Group III element and the Group V element described above can be used as the first shell, but it is preferable that the first shell is a crystal system (for example, a zinc blende structure) which is the same as or similar to the core described above. Specifically, GaP is more preferable.

In the present invention, from the viewpoint of reducing defects of the surface of the core shell particle to be obtained, it is preferable that a difference in lattice constant between the above-described core and the first shell is small. Specifically, it is preferable that the difference in lattice constant between the above-described core and the first shell is 10% or less.

Specifically, in a case where the above-described core is InP, it is preferable that the first shell is ZnSe (difference in lattice constant: 3.4%) or GaP (difference in lattice constant: 7.1%) as described above. Particularly, it is more preferable that the first shell is the same Group III-V semiconductor as the core and the Group III-V semiconductor is GaP from the viewpoint that a mixed crystal state can be easily made on the interface between the core and the first shell.

In the present invention, in a case where the first shell is a Group III-V semiconductor, the first shell may contain or dope another element (for example, the Group II element or the Group VI element described above) within the range that does not affect the magnitude correlation (core<first shell) of the band gap between the core and the first shell. Similarly, in a case where the first shell is a Group II-VI semiconductor, the first shell may contain or dope another element (for example, the Group III element or the Group V element described above) within the range that does not affect the magnitude correlation (core<first shell) of the band gap between the core and the first shell.

(Second Shell)

In a case where the specific semiconductor nanoparticle is a core shell particle having a multi-shell shape, the second shell is a material that covers at least a part of a surface of the first shell.

Here, in the present invention, it is possible to confirm whether at least a part of the surface of the first shell is covered with the second shell based on composition distribution analysis according to energy dispersive X-ray spectroscopy (EDX) using a transmission electron microscope (TEM).

In the present invention, from the viewpoints of suppressing defects at the interface between the first shell and the second shell and obtaining an excellent crystal phase with less defects, it is preferable that the second shell is a Group II-VI semiconductor containing a Group II element and a Group VI element or a Group III-V semiconductor containing a Group III element and a Group V element. Further, from the viewpoint that the material has high reactivity and a shell having an excellent crystal phase is easily obtained, it is more preferable that the second shell is a Group II-VI semiconductor.

In addition, examples of the Group II element, the Group VI element, the Group III element, and the Group V element include those respectively described in the section of the first shell.

A Group II-VI semiconductor obtained by appropriately combining the Group II element and the Group VI element described above can be used as the second shell, but it is preferable that the second shell is a crystal system (for example, a zinc blende structure) which is the same as or similar to the core described above. Specifically, ZnSe, ZnS, or a mixed crystal of these is preferable and ZnS is more preferable.

A Group III-V semiconductor obtained by appropriately combining the Group III element and the Group V element described above can be used as the second shell, but it is preferable that the second shell is a crystal system (for example, a zinc blende structure) which is the same as or similar to the core described above. Specifically, GaP is preferable.

In the present invention, from the viewpoint of reducing defects of the surface of the core shell particle to be obtained, it is preferable that a difference in lattice constant between the above-described first shell and the second shell is small. Specifically, it is preferable that the difference in lattice constant between the above-described first shell and the second shell is 10% or less.

Specifically, in a case where the above-described first shell is GaP, it is preferable that the second shell is ZnSe (difference in lattice constant: 3.8%) or ZnS (difference in lattice constant: 0.8%) as described above and more preferable that the second shell is ZnS.

In the present invention, in a case where the second shell is a Group II-VI semiconductor, the second shell may contain or dope another element (for example, the Group III element or the Group V element described above) within the range that does not affect the magnitude correlation (core<second shell) of the band gap between the core and the second shell. Similarly, in a case where the second shell is a Group III-V semiconductor, the second shell may contain or dope another element (for example, the Group II element or the Group VI element described above) within the range that does not affect the magnitude correlation (core<second shell) of the band gap between the core and the second shell.

In the present invention, from the viewpoint that epitaxial growth of the shell layer becomes easy and defects at an interface between layers are easily suppressed, it is preferable that each of the core, the first shell, and the second shell described above is a crystal system having a zinc blende structure.

In the present invention, from the viewpoint that the probability of excitons staying in the core becomes higher and the luminous efficacy is further increased, it is preferable that the band gap of the core from among the core, the first shell, and the second shell is the smallest and the core and the first shell are core shell particles having a type 1 (type I) band structure.

(Coordination Molecule)

From the viewpoint of imparting dispersibility, it is desirable that the surface of the core shell particle described above has coordination molecules.

From the viewpoint of dispersibility in a solvent, it is preferable that the coordination molecules contain an aliphatic hydrocarbon group.

Further, from the viewpoint of improving the dispersibility, a coordination molecule is preferably a ligand in which the number of carbon atoms in the main chain is at least 6 and more preferably a ligand in which the number of carbon atoms in the main chain is 10 or greater.

The coordination molecule may be a saturated compound or an unsaturated compound, and specific examples thereof include decanoic acid, lauric acid, myristic acid, palmitic acid, stearic acid, behenic acid, oleic acid, erucic acid, oleylamine, dodecylamine, dodecanethiol, 1,2-hexadecanethiol, trioctylphosphine oxide, and cetrimonium bromide, and these may be used alone or in combination of two or more kinds thereof.

<Method of Producing Semiconductor Nanoparticles>

A method of producing specific semiconductor nanoparticles is not particularly limited, and examples thereof include a method of mixing a compound containing zinc, a compound containing sulfur, and a compound containing indium in a solvent. At this time, semiconductor nanoparticles satisfying Expression (1a) can be obtained by adjusting the amount of the compound containing zinc to be blended and the amount of the compound containing indium to be blended.

As a preferred embodiment of the method of producing the specific semiconductor nanoparticle, a production method (hereinafter, also referred to as the "production method of the present invention") including the first step to the fourth step described below is exemplified.

A first step (1) of heating and stirring a solution obtained by adding a Group III raw material which contains a Group III element to a solvent A second step (2) of forming a core by adding a Group V raw material which contains a Group V element to the solution after the first step A third step (3) of forming a first shell by adding a raw material of the first shell to the solution after the second step; and A fourth step (4) of synthesizing the semiconductor nanoparticle by adding a Group II raw material which contains a Group II element to the solution after the third step to form the second shell Hereinafter, each step will be described.

(First Step)

The first step is a step of heating and stirring a solution obtained by adding a Group III raw material which contains a Group III element to a solvent.

(1) Solvent

Preferred examples of the solvent used in the first step include non-polar solvents having a boiling point of 170° C. or higher.

Specific examples of the non-polar solvents include aliphatic saturated hydrocarbon such as n-decane, n-dodecane, n-hexadecane, or n-octadecane; aliphatic unsaturated hydrocarbon such as 1-undecene, 1-dodecene, 1-hexadecene, or 1-octadecene; trioctylphosphine.

Among these, aliphatic unsaturated hydrocarbon having 12 or greater carbon atoms is preferable and 1-octadecene is more preferable.

(2) Group III Raw Material

Specific examples of the Group III raw material to be added to the solvent include indium chloride, indium oxide, indium acetate, indium nitrate, indium sulfate, indium acid; aluminum phosphate, aluminum acetylacetonate, aluminum chloride, aluminum fluoride, aluminum oxide, aluminum nitrate, aluminum sulfate; gallium acetylacetonate, gallium chloride, gallium fluoride, gallium oxide, gallium nitrate, and gallium sulfate, and these may be used alone or in combination of two or more kinds thereof.

Among these, from the viewpoints of easily realizing excellent luminous efficacy and easily controlling the emission wavelength in a visible range, an indium compound is preferable. From the viewpoint that impurity ions such as a chloride are unlikely to be taken into the core and excellent crystallinity is easily realized, it is more preferable to use indium acetate.

(3) Group II Raw Material

In the production method of the present invention, a Group II raw material containing a Group II element may be added together with the Group III raw material described above during the first step.

Specific examples of the Group II raw material including a Group II element include dimethyl zinc, diethyl zinc, zinc carboxylate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc acetate, and zinc sulfate.

From the viewpoint of obtaining excellent effects of the present invention, it is preferable that zinc acetate which is an acetate of Zn is used as the Group II raw material.

(4) Coordination Molecule

Coordination molecules may be added to the solvent in the first step. Examples of the coordination molecule used in the first step are the same as those described above. Among those, from the viewpoints of promoting the synthesis of the core and having an appropriate coordination force with respect to the core, oleic acid, palmitic acid, and stearic acid are preferable.

(5) Conditions for Heating and Stirring

In the first step, it is preferable that the above-described respective materials (the Group III raw material, the Group II raw material, and the coordination molecules) are dissolved in the solvent and also preferable that the above-described respective materials are dissolved in the solvent by heating and stirring the solution in a temperature range of 100° C. to 180° C. At this time, it is preferable that dissolved oxygen or moisture is removed from the mixed solution, in which the above-described respective materials have been dissolved, by heating the solution under reduced pressure.

Further, the time required for heating and dissolving is preferably 30 minutes or longer.

(Second Step)

The second step is a step of forming a core by adding a Group V raw material which contains a Group V element to the solution after the first step.

(1) Group V Raw Material

Specific examples of the Group V raw material containing a Group V element include tristrialkylsilylphosphine, trisdialkylsilylphosphine, trisdialkylaminophosphine; arsenic oxide, arsenic chloride, arsenic sulfate, arsenic bromide, arsenic iodide, nitric oxide, nitric acid, and ammonium nitrate.

Among these, a compound containing P is preferable. As the compound, it is preferable to use tristrialkylsilylphosphine or trisdialkylaminophosphine. Specifically, it is more preferable to use tristrimethylsilylphosphine.

(Third Step)

The third step is a step of forming a first shell by adding a raw material of the first shell to the solution after the second step. In this manner, a semiconductor nanoparticle precursor containing the core and the first shell is obtained.

Here, as the raw material of the first shell, a Group II raw material containing the Group II element described above and a Group VI raw material containing the Group VI element described below are exemplified in a case where the first shell is the Group II-VI semiconductor; and a Group III raw material containing the Group III element described above and a Group V raw material containing the Group V element described above are exemplified in a case where the first shell is the Group III-V semiconductor described above.

Here, in a case where the first shell is the Group III-V semiconductor described above, the Group III element contained in the Group III-V semiconductor is a Group III element different from the Group III element contained in the core.

Further, in a case where the first shell is the Group III-V semiconductor described above, since the Group V raw material containing a Group V element is the same raw material as the Group V raw material forming the core, a part of the Group V raw material used in the second step may be used and only the Group III raw material may be added in the third step.

(1) Group VI Raw Material

Specific examples of the Group VI raw material containing a Group VI element include sulfur, alkylthiol, trialkylphosphine sulfide, trialkenylphosphine sulfide, alkylamino sulfide, alkenylamino sulfide, cyclohexyl isothiocyanate, diethyl dithiocarbamic acid; trialkylphosphine selenium, trialkenylphosphine selenium, alkylamino selenium, alkenylamino selenium, trialkylphosphine telluride, trialkenylphosphine telluride, alkylamino telluride, and alkenylamino telluride.

Among these, from the viewpoint of excellent dispersibility of core shell particles to be obtained, it is preferable to use alkylthiol, specifically, more preferable to use dodecanethiol or octanethiol, and still more preferable to use dodecanethiol.

Among these materials, it is preferable to use the Group III raw material and the Group V raw material.

Particularly, as the Group III raw material, it is more preferable to use a compound containing Ga (such as gallium acetylacetonate, gallium chloride, gallium fluoride, gallium oxide, gallium nitrate, or gallium sulfate) and still more preferable to use a chloride of Ga.

In addition, as the Group V raw material, it is preferable to use a part of the Group V raw material used in the second step as described above.

(Fourth Step)

The fourth step is a step of synthesizing the semiconductor nanoparticle by adding a Group II raw material containing a Group II element to the solution after the third step to form the second shell.

Here, as the raw material of the second shell, a Group II raw material containing the Group II element described above and a Group VI raw material containing the Group VI element described above are exemplified in a case where the second shell is the Group II-VI semiconductor.

From the viewpoint of obtaining excellent effects of the present invention, as the Group II raw material, it is preferable to use fatty acid zinc (such as zinc acetate, zinc oleate, or zinc stearate) or zinc diethyl dithiocarbamate and more preferable to use fatty acid zinc.

Further, as the Group VI raw material, it is preferable to use alkylthiol and more preferable to use dodecanethiol.

From the viewpoint that the ratio of Zn/In in the semiconductor nanoparticles to be obtained is increased, it is preferable that the fourth step (lamination treatment) is performed multiple times. Specifically, the number of times of the lamination treatment is preferably 3 or more. Further, from the viewpoint of preventing the ratio of Zn/In from becoming extremely large, the number of times of the lamination treatment is preferably less than 10.

The content (% by mass) of the specific semiconductor nanoparticles in the dispersion liquid according to the embodiment of the present invention is not particularly limited, but is preferably in a range of 0.01% to 10% by mass and more preferably in a range of 0.1% to 5% by mass. Further, the content (mol/L) of the specific semiconductor nanoparticles in the dispersion liquid according to the embodiment of the present invention is not particularly limited, but is preferably in a range of 0.1 to 100 mol/L and more preferably in a range of 0.1 to 1 mol/L.

The specific semiconductor nanoparticles contained in the dispersion liquid according to the embodiment of the present invention may be used alone or in combination of two or more kinds thereof.

[(Meth)acrylate]

As described above, the dispersion liquid according to the embodiment of the present invention contains acrylate or methacrylate ((meth)acrylate). Since the dispersion liquid according to the embodiment of the present invention contains (meth)acrylate, a film containing the specific semiconductor nanoparticles can be easily prepared by curing the coated film or the like.

The (meth)acrylate is not particularly limited as long as the (meth)acrylate is a salt or an ester of (meth)acrylic acid.

As the (meth)acrylate, (meth)acrylic acid alkyl ester is preferable, and monofunctional (meth)acrylate represented by Formula (A) is more preferable.

$$CH_2=CR_1-COO-R_2 \quad \text{Formula (A):}$$

In Formula (A), $R_1$ represents a hydrogen atom or an alkyl group. As the alkyl group, an alkyl group having 1 to 3 carbon atoms is preferable and an alkyl group having one carbon atom is more preferable.

$R_2$ represents a hydrocarbon group which may have a heteroatom.

The number (number of carbon atoms) of carbon atoms in a hydrocarbon group represented by $R_2$ is preferably 6 or more, more preferably in a range of 6 to 16, and still more preferably in a range of 8 to 12.

Preferred examples of the hydrocarbon group include an aliphatic hydrocarbon group, an aromatic hydrocarbon group, and a group obtained by combining these. The aliphatic hydrocarbon group may be linear, branched, or cyclic, and specific examples thereof include a linear aliphatic hydrocarbon group, a branched aliphatic hydrocarbon group, and a cyclic aliphatic hydrocarbon group (alicyclic hydrocarbon group).

Examples of the aliphatic hydrocarbon group include an alkyl group, a cycloalkyl group, and an alkenyl group. Further, examples of the aromatic hydrocarbon group include a phenyl group and a naphthyl group.

Specific examples of the (meth)acrylate include methyl (meth)acrylate, ethyl (meth)acrylate, butyl (meth)acrylate, isobutyl (meth)acrylate, t-butyl (meth)acrylate, cyclohexyl (meth)acrylate, tetrahydrofurfuryl (meth)acrylate, 2-ethylhexyl (meth)acrylate, dodecyl (meth)acrylate (lauryl (meth) acrylate), isononyl (meth)acrylate, isodecyl (meth)acrylate, stearyl (meth)acrylate, 2-hydroxyethyl (meth)acrylate, 2-hydroxypropyl (meth)acrylate, 2-hydroxybutyl (meth)acrylate, isobornyl (meth)acrylate (isobornyl (meth)acrylate), butoxydiethylene glycol (meth)acrylate, benzyl (meth)acrylate, dicyclohexyl (meth)acrylate, dicyclopentanyl acrylate, 2-dicyclohexyloxyethyl (meth)acrylate, phenoxyethyl (meth) acrylate, dimethylaminoethyl (meth)acrylate, ethylene glycol di(meth)acrylate, 1,4-butanediol di(meth)acrylate, neopentyl glycol di(meth)acrylate, 1,6-hexanediol di(meth) acrylate, trimethylolpropane tri(meth)acrylate, nonanediol di(meth)acrylate, 2-morpholinoethyl (meth)acrylate, 9-anthryl (meth)acrylate, pentaerythritol tetra(meth)acrylate, dipentaerythritol hexa(meth)acrylate, trans-1,4-cyclohexanediol di(meth)acrylate, dicyclopentenyloxy ethyl (meth)acrylate, methoxyethyl (meth)acrylate, 3-methoxybutyl (meth)acrylate, methoxydipropylene glycol (meth) acrylate, methoxytripropylene glycol (meth)acrylate, methoxypolyethylene glycol (meth)acrylate, polyethylene glycol (meth)acrylate, polypropylene glycol (meth)acrylate, poly(ethylene glycol-tetramethylene glycol) (meth)acrylate, poly(propylene glycol-tetramethylene glycol) (meth)acrylate, polyethylene glycol-polypropylene glycol (meth)acrylate, and glycidyl (meth)acrylate.

The content of the (meth)acrylate in the dispersion liquid according to the embodiment of the present invention is not particularly limited, but is preferably in a range of 1% to 99.99% by mass and more preferably in a range of 10% to 99.9% by mass.

The (meth)acrylate contained in the dispersion liquid according to the embodiment of the present invention may be used alone or in combination of two or more kinds thereof.

[Optional Components]

The dispersion liquid according to the embodiment of the present invention may contain components other than the specific semiconductor nanoparticles and (meth)acrylate. Examples of such components include semiconductor nanoparticles other than the specific semiconductor nanoparticles and a solvent.

Examples of the solvent include aromatic hydrocarbon such as toluene; alkyl halide such as chloroform; aliphatic saturated hydrocarbon such as hexane, octane, n-decane, n-dodecane, n-hexadecane, or n-octadecane; aliphatic unsaturated hydrocarbon such as 1-undecene, 1-dodecene, 1-hexadecene, or 1-octadecene; and trioctylphosphine.

[Inclination of Tangent]

From the viewpoint of obtaining excellent effects of the present invention, in the composition of the present invention, the inclination of a tangent at a q value of 0.2 $nm^{-1}$ in a scattering intensity due to X-ray small angle scattering (SAXS) is preferably in a range of −3 to 0 and more preferably in a range of −2 to 0.

In a case where the inclination of the tangent is in the above-described range, the dispersibility of the specific semiconductor nanoparticles is further increased, and thus the initial luminous efficacy is further increased.

Here, the scattering intensity due to X-ray small angle scattering is measured through transmission arrangement by sealing the dispersion liquid in glass capillaries having a diameter of 1 mm using Nanostar (manufactured by Bruker AXS GmbH). Further, the inclination of the tangent is acquired by fitting the SAXS pattern using a theoretical scattering function given by sparse spherical particles having a Gaussian-type particle size distribution and calculating the inclination of the tangent at a q value of $0.2\ nm^{-1}$.

In the above-described specific semiconductor nanoparticles contained in the dispersion liquid according to the embodiment of the present invention, from the viewpoint of obtaining excellent effects of the present invention, it is preferable that the molar ratio of zinc to indium acquired by the X-ray photoelectron spectroscopy satisfies Expression (1b), the molar ratio of sulfur to indium acquired by the X-ray photoelectron spectroscopy satisfies Expression (2b), and the inclination of the tangent is in a range of −2 to 0.

[Film]

A film according to the embodiment of the present invention is a film produced using the dispersion liquid according to the embodiment of the present invention. The film according to the embodiment of the present invention contains the above-described specific semiconductor nanoparticles.

It is preferable that the film according to the embodiment of the present invention is a film obtained by coating a base material or the like with the dispersion liquid according to the embodiment of the present invention and then curing (polymerizing) (meth)acrylate in the dispersion liquid.

Since the film according to the embodiment of the present invention exhibits high initial luminous efficacy and excellent moisture resistance, the film can be applied to a wavelength conversion film used for a display, a photoelectron conversion (or wavelength conversion) film of a solar cell, a biological label, a thin film transistor, and the like.

EXAMPLES

Hereinafter, the present invention will be described in more detail based on examples. However, the present invention is not limited to these examples.

[Production of Semiconductor Nanoparticle-Containing Dispersion Liquid]

As described below, a semiconductor nanoparticle-containing dispersion liquid was produced.

<Production of Semiconductor Nanoparticles>

First, as described below, a toluene dispersion liquid containing semiconductor nanoparticles was produced.

(First Step)

32 mL of octadecene, 140 mg (0.48 mmol) of indium acetate, and 48 mg (0.24 mmol) of zinc acetate were added to a flask, heated and stirred at 110° C. in a vacuum, and degassed for 90 minutes while the raw materials were sufficiently dissolved.

(Second Step)

Next, the flask was heated to 300° C. in a nitrogen flow, and 0.24 mmol of tristrimethylsilylphosphine dissolved in approximately 4 mL of octadecene was added to the flask at the time of the temperature of the solution being stabilized.

Thereafter, the flask was heated for 120 minutes in a state in which the temperature of the solution was set to 230° C. It was confirmed that the color of the solution became red and particles (core) were formed.

(Third Step)

Next, 30 mg (0.18 mmol) of gallium chloride and 125 μL (0.4 mmol) of oleic acid which were dissolved in 8 mL of octadecene were added to the solution in a state in which the solution was heated to 200° C., and the solution was further heated for approximately 1 hour, thereby obtaining a dispersion liquid of a semiconductor nanoparticle precursor including InP (core) doped with Zn and GaP (first shell).

(Fourth Step)

Thereafter, ZnS (second shell) covering the surface of the first shell was formed.

Specifically, the temperature was held to 150° C. to 240° C., a Group VI raw material (for example, sulfur (ODE-S) dissolved in octadecene, sulfur (TOP-S) dissolved in trioctylphosphine, or linear alkanethiol (such as butanethiol, octanethiol, or dodecanethiol)) or a Group II raw material (fatty acid zinc (such as zinc acetate, zinc oleate, or zinc stearate) or zinc diethyl dithiocarbamate) were alternately added thereto, and the state thereof was held for 15 minutes to 4 hours (lamination treatment). This treatment was performed once, three times, four times, five times, or ten times, thereby obtaining ZnS (second shell). In this manner, a dispersion liquid containing semiconductor nanoparticles including InP (core) doped with Zn, GaP (first shell) covering the surface of the core, and ZnS (second shell) covering the surface of the first shell was obtained.

The obtained dispersion liquid was cooled to room temperature, ethanol was added thereto, and centrifugation was performed on the dispersion liquid so that particles were precipitated. The supernatant was disposed of and the resultant was dispersed in a toluene solvent, thereby obtaining a toluene dispersion liquid containing semiconductor nanoparticles.

<Blending of Dispersion Liquid Compound>

Further, a dispersion liquid compound ((meth)acrylate (dicyclopentanyl acrylate (FANCRYL FA-513AS, manufactured by Hitachi Chemical Co., Ltd.) or lauryl methacrylate) or an epoxy compound (LDO)) was blended into the obtained toluene dispersion liquid, the dispersion liquid was treated using a rotary evaporator (DPE-1210, manufactured by EYELA) (45° C., 50 minutes) so that toluene serving as a solvent was volatilized, and semiconductor nanoparticles were allowed to be dispersed in (meth)acrylate or an epoxy compound to obtain a semiconductor nanoparticle-containing dispersion liquid containing semiconductor nanoparticles and (meth)acrylate or an epoxy compound (fifth step). Further, the content of the semiconductor nanoparticles in the obtained semiconductor nanoparticle-containing dispersion liquid was 1% by mass, and the content of the dispersion liquid compound therein was 99% by mass.

Among the semiconductor nanoparticle-containing dispersion liquids produced in the above-described manner, the ratios of "Zn/In", the ratios of "S/In", the "inclinations of the tangent", and the "average particle diameters" of the dispersion liquids in the form in which dodecanethiol was used as the Group VI raw material and fatty acid zinc was used as the Group II raw material in the fourth step (Examples 1 to 5 and Comparative Examples 1 to 4) are listed in Table 1. The methods of measuring the ratio of "Zn/In", the ratio of "S/In", the "inclination of the tangent", and the "average particle diameter" are as described above. In addition, the numbers of times of the lamination treatment in the fourth step and the used dispersion liquid compounds in Examples 1 to 5 and Comparative Examples 1 to 4 are as listed in Table 1.

The semiconductor nanoparticles contained in the dispersion liquids of Examples 1 to 5 and Comparative Example 3 correspond to the above-described specific semiconductor nanoparticles because zinc, sulfur, and indium are detected by X-ray photoelectron spectroscopy and the molar ratio of zinc to indium acquired by the X-ray photoelectron spectroscopy satisfies Expression (1a).

On the contrary, the semiconductor nanoparticles contained in the dispersion liquids of Comparative Examples 1, 2, and 4 do not correspond to the above-described specific semiconductor nanoparticles because zinc, sulfur, and indium are detected by X-ray photoelectron spectroscopy, but the molar ratio of zinc to indium acquired by the X-ray photoelectron spectroscopy does not satisfy Expression (1a).

Further, the dispersion liquids of Examples 1 to 5 correspond to the above-described semiconductor nanoparticle-containing dispersion liquid according to the embodiment of the present invention because the dispersion liquids contain specific semiconductor nanoparticles and (meth)acrylate (dicyclopentanyl acrylate or lauryl methacrylate).

On the contrary, the dispersion liquid of Comparative Example 3 does not correspond to the above-described semiconductor nanoparticle-containing dispersion liquid according to the embodiment of the present invention because the dispersion liquid contains the specific semiconductor nanoparticles, but does not contain (meth)acrylate (contains an epoxy compound).

[Evaluation of Luminous Efficacy]

The emission intensity of each of the semiconductor nanoparticle-containing dispersion liquids was measured using a fluorescence spectrophotometer FluoroMax-3 (manufactured by HORIBA Jobin Yvon) by adjusting the concentration thereof such that the absorbance at an excitation wavelength of 450 nm was set to 0.2. Further, the luminous efficacy was calculated by performing relative comparison with a quantum dot sample whose luminous efficacy was known. The obtained luminous efficacy was calculated as a ratio of the number of emission photons to the number of absorption photons from excitation light. The results obtained in Examples 1 to 5 and Comparative Examples 1 to 4 are listed in Table 1 (initial luminous efficacy). Practically, the initial luminous efficacy is preferably 60% or greater.

Further, after 3 ml of toluene was added to each of the obtained semiconductor nanoparticle-containing dispersion liquids (200 μL), water (1 μL) was forcibly added to the resulting dispersion liquid, and the resulting solution was allowed to stand in a light-shielding state (60° C.) for 12 hours, the luminous efficacy was evaluated in the same manner as described above. The results are listed in Table 1 (after the moisture resistance durability test).

Further, the maintenance factor (=luminous efficacy after moisture resistance durability test/initial luminous efficacy) was calculated from the initial luminous efficacy and the luminous efficacy after the moisture resistance durability test. The results are listed in Table 1 (maintenance factor). From the viewpoint of the moisture resistance, the maintenance factor is preferably 80% or greater.

TABLE 1

| | Number of times of lamination treatment | Dispersion liquid compound | Zn/In (molar ratio) | S/In (molar ratio) | Inclination of tangent | Average particle diameter [nm] | Luminous efficacy Initial | Luminous efficacy After moisture resistance durability test | Maintenance factor |
|---|---|---|---|---|---|---|---|---|---|
| Comparative Example 1 | Once | Dicyclopentanyl acrylate | 2.25 | 1.25 | −1 | 4.2 | 70% | 39% | 56% |
| Comparative Example 2 | Once | LDO (Limonene Dioxide) | 2.2 | 1.1 | −4 | — | 40% | 20% | 50% |
| Example 1 | Four times | Dicyclopentanyl acrylate | 7.1 | 4.6 | −0.5 | 4.4 | 71% | 60% | 85% |
| Example 2 | Five times | Dicyclopentanyl acrylate | 7.9 | 4.2 | −0.25 | 4.6 | 72% | 62% | 86% |
| Example 3 | Four times | Lauryl methacrylate | 5.25 | 7 | −1 | 4.6 | 69% | 59% | 86% |
| Example 4 | Five times | Lauryl methacrylate | 4.75 | 7.5 | −0.4 | 4.8 | 70% | 60% | 86% |
| Example 5 | Three times | Dicyclopentanyl acrylate | 2.4 | 3.4 | −2 | 4.2 | 67% | 55% | 82% |
| Comparative Example 3 | Five times | LDO (Limonene Dioxide) | 5.6 | 5.2 | −3 | — | 50% | 35% | 70% |
| Comparative Example 4 | Ten times | Dicyclopentanyl acrylate | 9 | 10.6 | −1 | 4.6 | 63% | 49% | 78% |

In Table 1, the structure of limonene dioxide (LDO) (an alicyclic epoxy compound manufactured by RENESSENZ LLC) is as shown below.

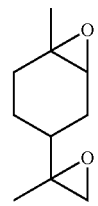

As shown in Table 1, all dispersion liquids of Examples 1 to 5 containing the specific semiconductor nanoparticles and (meth)acrylate exhibited high initial luminous efficacy and excellent moisture resistance. Among these, the dispersion liquids of Examples 1 to 4, in which the ratio of Zn/In was greater than 2.4, exhibited higher initial luminous efficacy and further excellent moisture resistance.

Meanwhile, in the dispersion liquids of Comparative Examples 1 and 4 in which the ratio of Zn/In in the semiconductor nanoparticles was out of a specific range, the moisture resistance was insufficient. Further, in the dispersion liquids of Comparative Examples 2 and 3 containing the specific semiconductor nanoparticles and free from (meth)acrylate (containing an epoxy compound), the initial luminous efficacy and the moisture resistance were insufficient.

Further, the ratios of "Zn/In", the ratios of "S/In", the "inclinations of the tangent", and the "average particle diameters" of the dispersion liquids in the form in which Group VI raw materials other than dodecanethiol were used and the form in which Group II raw materials other than fatty acid zinc were used in the fourth step were measured. The results thereof were the same as those listed in Table 1, and the results obtained by evaluating the luminous efficacies thereof were the same as the results listed in Table 1.

What is claimed is:

1. A semiconductor nanoparticle-containing dispersion liquid containing:
    semiconductor nanoparticles from which zinc, sulfur, and indium are detected by X-ray photoelectron spectroscopy; and
    acrylate or methacrylate,
    wherein a molar ratio of the zinc to the indium in the semiconductor nanoparticles which is acquired by the X-ray photoelectron spectroscopy satisfies Expression (1a), wherein $2.25 < Zn/In \leq 9$ \hfill (1a).

2. The semiconductor nanoparticle-containing dispersion liquid according to claim 1,
    wherein a molar ratio of the sulfur to the indium in the semiconductor nanoparticles which is acquired by the X-ray photoelectron spectroscopy satisfies Expression (2a), wherein $1.25 < S/In < 10.6$ \hfill (2a).

3. The semiconductor nanoparticle-containing dispersion liquid according to claim 1,
    wherein, in a scattering intensity due to X-ray small angle scattering, an inclination of a tangent at a q value of 0.2 $nm^{-1}$ is in a range of −3 to 0.

4. The semiconductor nanoparticle-containing dispersion liquid according to claim 1,
    wherein the molar ratio of the zinc to the indium in the semiconductor nanoparticles which is acquired by the X-ray photoelectron spectroscopy satisfies Expression (1b), and the molar ratio of the sulfur to the indium in the semiconductor nanoparticles which is acquired by the X-ray photoelectron spectroscopy satisfies Expression (2b), and
    in a scattering intensity due to X-ray small angle scattering, an inclination of a tangent at a q value of 0.2 $nm^{-1}$ is in a range of −2 to 0, wherein $2.4 < Zn/In \leq 7.9$ \hfill (1b), and $3.4 < S/In \leq 7.5$ \hfill (2b).

5. The semiconductor nanoparticle-containing dispersion liquid according to claim 1,
    wherein the semiconductor nanoparticles have an average particle diameter of 6 nm or less.

6. The semiconductor nanoparticle-containing dispersion liquid according to claim 5,
    wherein the semiconductor nanoparticles have the average particle diameter of 3 nm to 5 nm.

7. The semiconductor nanoparticle-containing dispersion liquid according to claim 1,
    wherein the semiconductor nanoparticle includes:
        a core which contains a Group III element and a Group V element;
        a first shell which covers at least a part of a surface of the core; and
        a second shell which covers at least a part of the first shell.

8. The semiconductor nanoparticle-containing dispersion liquid according to claim 7,
    wherein the Group III element contained in the core is In, and
    the Group V element contained in the core is any one of P, N, or As.

9. The semiconductor nanoparticle-containing dispersion liquid according to claim 8,
    wherein the Group III element contained in the core is In, and
    the Group V element contained in the core is P.

10. The semiconductor nanoparticle-containing dispersion liquid according to claim 7,
    wherein the core further contains a Group II element.

11. The semiconductor nanoparticle-containing dispersion liquid according to claim 10,
    wherein the Group II element contained in the core is Zn.

12. The semiconductor nanoparticle-containing dispersion liquid according to claim 7,
    wherein the first shell contains a Group II element or a Group III element, and
    in a case where the first shell contains the Group III element, the Group III element contained in the first shell is a Group III element different from the Group III element contained in the core.

13. The semiconductor nanoparticle-containing dispersion liquid according to claim 7,
    wherein the first shell is a Group II-VI semiconductor which contains a Group II element and a Group VI element or a Group III-V semiconductor which contains a Group III element and a Group V element, and
    in a case where the first shell is the Group III-V semiconductor, the Group III element contained in the Group III-V semiconductor is a Group III element different from the Group III element contained in the core.

14. The semiconductor nanoparticle-containing dispersion liquid according to claim 13,
    wherein in a case where the first shell is the Group II-VI semiconductor, the Group II element is Zn and the Group VI element is Se or S, and
    in a case where the first shell is the Group III-V semiconductor, the Group III element is Ga and the Group V element is P.

15. The semiconductor nanoparticle-containing dispersion liquid according to claim 13,
    wherein the first shell is the Group III-V semiconductor, the Group III element is Ga, and the Group V element is P.

16. The semiconductor nanoparticle-containing dispersion liquid according to claim 7, wherein the second shell is a Group II-VI semiconductor which contains a Group II element and a Group VI element or a Group III-V semiconductor which contains a Group III element and a Group V element.

17. The semiconductor nanoparticle-containing dispersion liquid according to claim 16,
wherein the second shell is the Group II-VI semiconductor,
the Group II element is Zn, and
the Group VI element is S.

18. The semiconductor nanoparticle-containing dispersion liquid according to claim 7,
wherein the core, the first shell, and the second shell are respectively a crystal system having a zinc blende structure.

19. The semiconductor nanoparticle-containing dispersion liquid according to claim 7,
wherein, among the core, the first shell, and the second shell, a band gap of the core is the smallest, and
the core and the first shell respectively have a type 1 band structure.

20. A film which is produced using the semiconductor nanoparticle-containing dispersion liquid according to claim 1.

* * * * *